(12) United States Patent
Chen et al.

(10) Patent No.: US 10,365,672 B2
(45) Date of Patent: Jul. 30, 2019

(54) METHOD AND SYSTEM FOR MONITORING TEMPERATURE OF WAFER

(71) Applicant: TAIWAN SEMICONDUCTOR MANUFACTURING CO., LTD., Hsinchu (TW)

(72) Inventors: Shu-Han Chen, Changhua (TW); Sheng-Hung Lin, Taichung (TW); Han-Hsuan Hsu, Taichung (TW); Chien-Fang Lin, Tainan County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 172 days.

(21) Appl. No.: 15/434,201

(22) Filed: Feb. 16, 2017

(65) Prior Publication Data

US 2018/0166309 A1  Jun. 14, 2018

Related U.S. Application Data

(60) Provisional application No. 62/431,516, filed on Dec. 8, 2016.

(51) Int. Cl.
*G06F 19/00* (2018.01)
*G05D 23/19* (2006.01)
*H01L 21/67* (2006.01)

(52) U.S. Cl.
CPC ..... *G05D 23/1917* (2013.01); *G05D 23/1931* (2013.01); *H01L 21/67109* (2013.01); *H01L 21/67248* (2013.01)

(58) Field of Classification Search
USPC .......................................................... 700/121
See application file for complete search history.

(56) References Cited

U.S. PATENT DOCUMENTS

| | | | | |
|---|---|---|---|---|
| 5,436,172 A | * | 7/1995 | Moslehi | B24B 37/013 117/85 |
| 5,638,687 A | * | 6/1997 | Mizohata | G03F 7/168 236/78 D |
| 2015/0370245 A1 | * | 12/2015 | Sugishita | C23C 16/52 700/121 |
| 2016/0079101 A1 | * | 3/2016 | Yanai | H01L 21/67103 438/706 |
| 2017/0005019 A1 | * | 1/2017 | Wilby | H01L 21/67103 |

\* cited by examiner

*Primary Examiner* — Md Azad
(74) *Attorney, Agent, or Firm* — McClure, Qualey & Rodack, LLP

(57) ABSTRACT

A system includes a cooling device, a memory, and a processor. The cooling device is configured to detect a temperature of a wafer and to provide air to the wafer. The memory is configured to store computer program codes. The processor is configured to execute the computer program codes in the memory to: determine whether the temperature of the wafer meet a predetermined requirement; adjust the temperature of the wafer on condition that the temperature does not meet the predetermined requirement; and control the cooling device to detect the temperature of the wafer again, in order to verify whether an adjusted temperature of the wafer meet predetermined requirement.

20 Claims, 3 Drawing Sheets

METHOD AND SYSTEM FOR MONITORING TEMPERATURE OF WAFER

PRIORITY CLAIM AND CROSS-REFERENCE

This application claims priority to U.S. Provisional Application Ser. No. 62/431,516, filed Dec. 8, 2016, which is herein incorporated by reference.

BACKGROUND

Wafers are processed in many ways, some of which are done in a process chamber of a wafer processing tool. In stages of wafer processing, including, for example, pre-cleaning, post-cleaning, or etching, chemical materials are added to a surface of the wafer to form or modify layers of material on the surface. To accelerate chemical reactions for the process, the wafer often needs to be heated to a suitable temperature. To keep reliability of the wafers, temperature control of the wafers is employed during the stages of wafer processing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
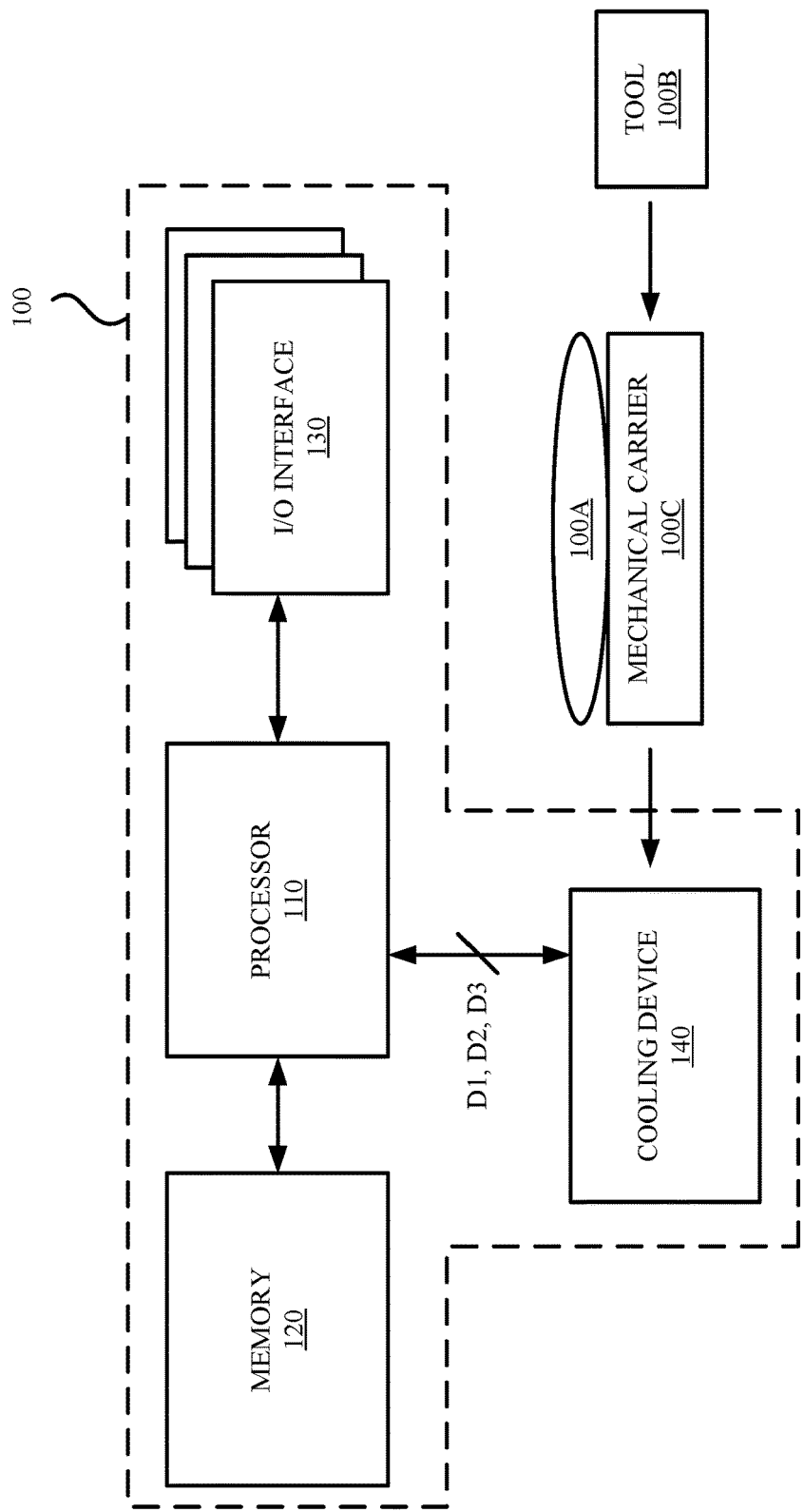
FIG. 1 is a schematic diagram of an electronic device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Reference is now made to FIG. 1. FIG. 1 is a schematic diagram of a system 100, in accordance with some embodiments of the present disclosure. In some embodiments, the system 100 is applied in an integrated circuit (IC) foundry, in order to monitor thermal effect on a wafer 100A.

As illustratively shown in FIG. 1, the system 100 includes a processor 110, a memory 120, Input/Output (I/O) interfaces 130, and a cooling device 140. The processor 110 is coupled to the memory 120, the I/O interfaces 130, and the cooling device 140. In various embodiments, the processor 110 is a central processing unit (CPU), an application specific integrated circuit (ASIC), a multi-processor, a distributed processing system, or a suitable processing unit.

The implementations of the processor 110 are given for illustrative purposes only. Various circuits or units to implement the processor 110 are within the contemplated scope of the present disclosure.

The memory 120 stores one or more program codes for monitoring thermal effect on the wafer 100A. For illustration, the memory 120 stores a program code encoded with a set of instructions for monitoring thermal effect on the wafer 100A and for controlling the cooling device 140. The processor 110 is able to execute the program codes stored in the memory 120, and the operations of monitoring thermal effect are able to be automatically performed.

In some embodiments, the memory 120 is a non-transitory computer readable storage medium encoded with, i.e., storing, a set of executable instructions for monitoring thermal effect on the wafer 100A. For illustration, the memory 120 stores executable instructions for performing operations including, for example, operation S310, S320, and S330 illustrated in FIG. 3 below. In some embodiments, the computer readable storage medium is an electronic, magnetic, optical, electromagnetic, infrared, and/or a semiconductor system (or apparatus or device). For example, the computer readable storage medium includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer readable storage medium includes a compact disk-read only memory (CD-ROM), a compact disk-read/write (CD-R/W), and/or a digital video disc (DVD).

The implementations of the computer readable storage medium are given for illustrative purposes only. Various computer readable storage mediums able to store the executable instructions are within the contemplated scope of the present disclosure.

In some embodiments, the wafer 100A discussed above is moved by a mechanical carrier 100C from a tool 100B to the cooling device 140. In other words, before moving to the cooling device 140, the wafer 100A is processed by the tool 100B. In some embodiments, the mechanical carrier 100C is a robotic arm. In some other embodiments, the mechanical carrier 100C includes a cassette that is configured to contain the wafer 100A and transfer the same in a semiconductor foundry.

The above examples of the mechanical carrier 100C are given for illustrative purposes only. Various types of the mechanical carriers 100C to move the wafer 100A are within the contemplated scope of the present disclosure.

The tool 100B is configured to perform at least one semiconductor process on the wafer 100A. In some embodiments, the at least one semiconductor process are associated with the temperature of the wafer 100A. For example, the at least one semiconductor process includes an etching process, a deposition process, an oxidation process, an ion implantation process, and/or a diffusion process. The processes mentioned above are given for illustrative purposes only. Various processes to be involved with the temperature of the wafer 100A are within the contemplated scope of the present disclosure.

The I/O interfaces 130 receive inputs or commands from various control devices, which, for example, are operated by an equipment engineer or a process engineer. Accordingly, the system 100 is able to be manipulated with the inputs or commands received by the I/O interfaces 130. In some embodiments, the I/O interfaces 130 include a display configured to display the status of executing the program code. In some embodiments, the I/O interfaces 130 include a graphical user interface (GUI). In some other embodiments, the I/O interfaces 130 include a keyboard, keypad, mouse, trackball, track-pad, touch screen, cursor direction keys, or the combination thereof, for communicating information and commands to processor 110.

The implementations of the I/O interfaces 130 are given for illustrative purposes only. Various implementations of the I/O interfaces 130 are within the contemplated scope of the present disclosure.

The cooling device 140 is configured to detect a temperature of the wafer 100A, and to adjust the temperature of the wafer 100A on condition that the detected temperature of the wafer 100A does not meet a predetermined requirement. In some embodiments, the cooling device 140 is configured to transmit data D1, D2, and/or D3 to the processor 110, based on the detected temperature, in order to be controlled by the processor 110. The detailed operations of the cooling device 140 are given below with reference to FIG. 2 and FIG. 3 below.

Figure 2:
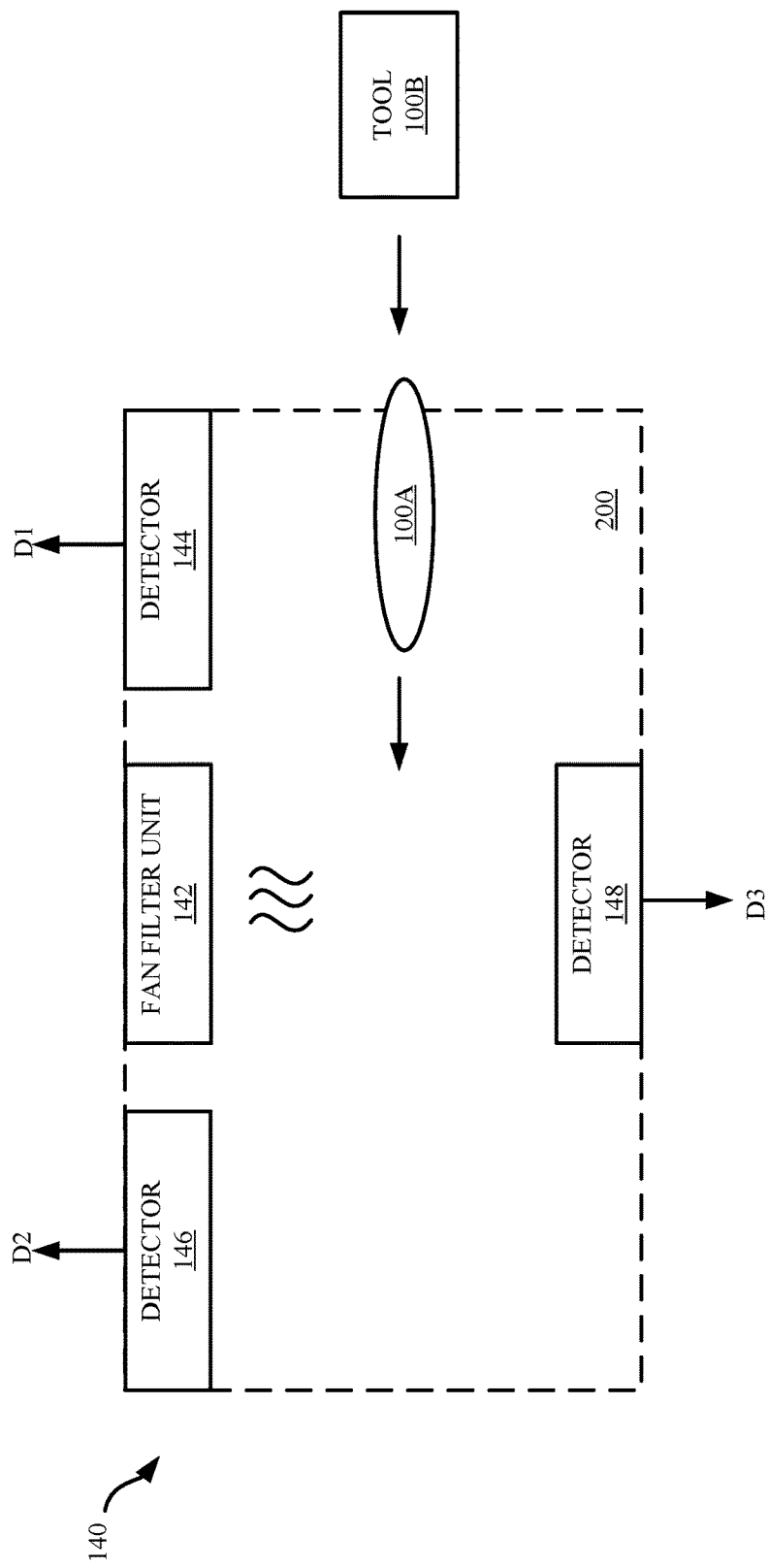
FIG. 2 is a schematic diagram of the cooling device in FIG. 1, in accordance with some embodiments of the present disclosure.

Reference is now made to FIG. 2. FIG. 2 is a schematic diagram of the cooling device 140 in FIG. 1, in accordance with some embodiments of the present disclosure. With respect to FIG. 1, like elements in FIG. 2 are designated with the same reference numbers for ease of understanding. In some embodiments, the cooling device 140 is applied to an air conditioning system of a semiconductor foundry.

As illustratively shown in FIG. 2, the cooling device 140 includes a fan filter unit 142, a detector 144, a detector 146, and a detector 148. The fan filter unit 142 is configured to provide air to the wafer 100A. In some embodiments, the cooling device 140 is arranged in a room 200. For illustration, the fan filter unit 142 is located at a top of the room 200, in order to provide an air flow to the room 200. In some embodiments, the room 200 is a cleaned room and/or a laboratory. In some embodiments, the fan filter unit 142 includes fans (not shown) configured to provide air and filters (not shown) configured to remove harmful airborne particles from the air. For example, in some embodiments, the filters include high-efficiency particular air (HEPA) filters, ultra-low particular air (ULPA) filters, and/or minimum efficiency reporting value (MERV) filters. Effectively, the air in the room 200 is cleaned with the air recirculation of the fan filter unit 142.

The arrangements of the room 200 and the filters are given for illustrative purposes only. Various arrangements of the room 200 and the filters are within the contemplated scope of the present disclosure.

The detector 144 is arranged at a first side of the fan filter unit 142. The first side of the fan filter unit 142 is adjacent to the tool 100B in FIG. 1. The detector 144 is configured to detect a temperature of the wafer 100A during the wafer 100A is moved by the mechanical carrier 100C from the tool 100B in FIG. 1 to the room 200. For illustration, when the wafer 100A is moved to a location below the detector 144, a surface of the wafer 100A is opposite to the detector 144. Accordingly, the detector 144 is able to detect the temperature of the surface of the wafer 100A, in order to generate data D1 and to transmit the same to the processor 110 in FIG. 1. In some embodiments, the data D1 indicates the value of the detected temperature of the wafer 100A. In some embodiments, the data D1 is encoded in a form of a temperature map. In some embodiments, the term "temperature map" is referred to as a map showing a temperature or thermal energy distribution within the surface of the wafer 100A.

The format of the data D1 is given for illustrative purposes only. Various formats of the data D1, which are sufficient to indicate the temperature of the wafer 100A, are within the contemplated scope of the present disclosure.

In some embodiments, the detector 144 is implemented with a thermal detector. In some embodiments, the detector 144 is implemented with a temperature sensor, which includes, for example, infrared temperature-sensing devices. The implementations of the detector 144 are given for illustrative purposes only. Various implementations of the detector 144 are within the contemplated scope of the present disclosure.

As described above, the data D1, which include information of the detected temperature, is transmitted to the processor 110 in FIG. 1. In some embodiments, the processor 110 processes the data D1 to compare the detected temperature with a predetermined requirement. In some embodiments, the predetermined requirement indicates information including a predetermined range or value associated with the at least one semiconductor process performed by the tool 100B. In some embodiments, the predetermined range or value are determined based on an expected temperature for a wafer that is just processed by the tool 100B, or based on an expected temperature for parameters associated with the at least semiconductor process performed by the tool 100B. In some embodiments, the above parameters include an outgassing rate, a speed of a chemical reaction, etc. In some embodiments, the above information is stored in the memory 120. In some embodiments, the predetermined requirement indicates information including an expected temperature map for the wafer being processed by the tool 100B. In some embodiments, the above information is stored in the memory 120.

The above configurations of the predetermined requirement are given for illustrative purposes only. Various configurations of the predetermined requirement are within the contemplated scope of the present disclosure.

In some embodiments, the processor 110 is configured to determine whether to adjust the temperature of the wafer 100A based on the comparison result of the detected temperature and the predetermined requirement. If the detected temperature does not meet the predetermined requirement, the processor 110 determines to adjust the temperature of the wafer 100A.

For example, if the detected temperature exceeds the predetermined range or value defined in the predetermined requirement, the processor 110 then assigns a control command to the fan filter unit 142. Accordingly, a parameter, which is associated with the air flow, of the fan filter unit 142 is adjusted to lower the temperature of the wafer 100A. In some embodiments, the parameter includes a flow rate. In this example, the flow rate is increased to accelerate the heat dissipation of the wafer 100A, in order to lower the temperature of the wafer 100A. Various parameters to control the air flow are within the contemplated scope of the present disclosure.

Alternatively, if the detected temperature is lower than the predetermined range or value defined in the predetermined requirement, the processor 110 then assigns a control command to the fan filter unit 142. Accordingly, the parameter, which is associated with the air flow, of the fan filter unit 142 is adjusted, in order to slow down the heat dissipation of the wafer 100A.

In some embodiments, the processor 110 assigns a control command to the mechanical carrier 100C, which moves the wafer 100A, to adjust the temperature of the wafer 100A. For example, if the detected temperature exceeds the predetermined range or value defined in the predetermined requirement, the processor 110 then assigns a control command to the mechanical carrier 100C. Accordingly, a moving speed of the mechanical carrier 100C is reduced to increase a duration time for the wafer 100A staying in the room 200. As a result, the cooling time of the wafer 100A is increased, and the temperature of the wafer 100A is thus reduced.

Alternatively, if the detected temperature is lower than the predetermined range or the predetermined value defined in the predetermined requirement, the processor 110 then assigns a control command to the mechanical carrier 100C. Accordingly, the moving speed of the mechanical carrier 100C is increased to reduce the duration time for the wafer 100A staying in the room 200. As a result, the cooling time of the wafer 100A is reduced, and the heat dissipation of the wafer 100A is relatively reduced.

The detector 146 is disposed at a second side of the fan filter unit 142. Compared with the first side of the fan filter unit 142 where the detector 144 is located, the second side of the fan filter unit 142 is far away from the tool 100B. In some embodiments, the detector 146 is configured to detect the temperature of the wafer 100A during the wafer 100A is moved by the mechanical carrier 100C from the first side to the second side of the fan filter unit 142.

For illustration, the wafer 100A will be moved out the room 200 to another tool (not shown) for performing next semiconductor process or a warehouse for storing the wafer 100A. During the wafer 100A is moved out the room 200, the wafer 100A is moved from the first side to the second side of the fan filter unit 142. When the wafer 100A is moved to a location below the detector 146, the surface of the wafer 100A is opposite to the detector 146. Accordingly, the detector 146 is able to detect the temperature of the surface of the wafer 100A, in order to generate data D2 and to transmit the same to the processor 110 in FIG. 1. In some embodiments, the data D2 indicates the value of the detected temperature of the wafer 100A after being adjusted in the room 200. In some embodiments, similar to the data D1, the data D2 may be encoded in a form of the temperature map.

In some embodiments, the detector 146 is implemented with the thermal sensors or temperature sensors discussed above. Various implementations of the detector 146 are within the contemplated scope of the present disclosure.

As described above, the data D2, which include information of the adjusted temperature, is transmitted to the processor 110 in FIG. 1. In some embodiments, the processor 110 processes the data D2 to compare the adjusted temperature with the predetermined requirement. If the detected temperature does not meet the predetermined requirement, the processor 110 then records an identification number of the wafer 100A to the memory 120 for follow-up checking of the wafer 100A.

The detector 148 is located at bottom of the room 200. The detector 148 is located between the detector 144 and the detector 146, and is located opposite to the fan filter unit 142. The detector 148 is configured to detect a room temperature of the room 200, in order to verify whether the parameter (e.g., the flow rate discussed above) of the fan filter unit 142 is adjusted to an expected value. In some embodiments, the detector 148 detects the room temperature of the room 200 to generate data D3 and to transmit the same to the processor 110 in FIG. 1. In some embodiments, the data D3 indicates a value of the detected room temperature. In some embodiments, on condition that the room temperature is abnormal, or that the parameter of the fan filter unit 142 is not adjusted to the expected value, the processor 110 in FIG. 1 is further configured to adjust the parameter of the fan filter unit 142 again. In some embodiments, the data D3 is encoded in a form of a temperature trend chart. In some embodiments, the term "temperature trend chart" is referred to as a chart showing a relationship between time and the room temperature.

The above form of the data D3 is given for illustrative purposes only. Various forms, which are sufficient to observe the value of the room temperature, of the data D3 are within the contemplated scope of the present disclosure. In some embodiments, the detector 148 is implemented with the temperature sensors discussed above. Various implementations of the detector 148 are within the contemplated scope of the present disclosure.

The arrangements of the cooling device 140 are given for illustrative purposes only. Various arrangements of the cooling device 140 are within the contemplated scope of the present disclosure. For example, in some embodiments, the cooling device 140 can be operated without the detector 148.

Figure 3:
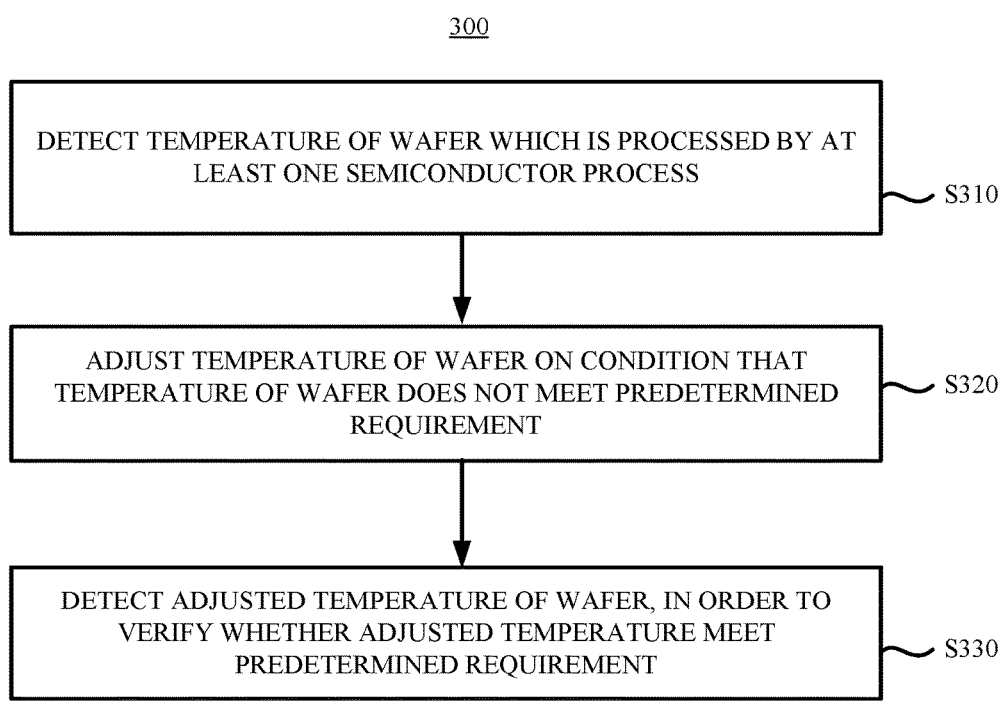
FIG. 3 is a flow chart of a method, in accordance with some embodiments of the present disclosure.

Reference is now made to FIG. 3. FIG. 3 is a flow chart of a method 300, in accordance with some embodiments of the present disclosure. In some embodiments, the method 300 is encoded by program codes stored in the memory 120 in FIG. 1. In some embodiments, the processor 110 in FIG. 1 is able to execute the program codes stored in the memory 120, to perform the method 300. For ease of understanding, operations of the method 300 are described with reference to FIG. 1 and FIG. 2.

In some embodiments, the method 300 includes operation S310, operation S320, and operation S330. In operation S310, the temperature of the wafer is detected, in which the wafer is processed by at least one semiconductor process.

For illustration, as discussed above, the temperature of the wafer 100A in FIG. 1 is detected by the detector 144 in FIG. 2 during the wafer 100A is moved from the tool 100B in FIG. 1 to the cooling device 140 in FIGS. 1 and 2. The tool 100B is configured to perform at least one semiconductor process, which include, for example, an etching process, on the wafer 100A. In other words, the wafer 100A is moved to the cooling device 140 after being processed by the tool 100B. When the wafer 100A is moved to the location opposite to the detector 144, the detector 144 detects the temperature of the surface of the wafer 100A, and accordingly generates the data D1 including the value of the detected temperature to the processor 110.

In operation S320, the temperature of the wafer is adjusted on condition that the temperature of the wafer does not meet the predetermined requirement.

For illustration, the processor 110 processes the data D1 to compare the detected temperature with the predetermined requirement. If the detected temperature does not meet the predetermined requirement, the processor 110 determines to adjust the temperature of the wafer 100A. On condition that the detected temperature exceeds the predetermined requirement, the processor 110 then controls the fan filter unit 142 to lower the temperature of the wafer 100A. For example, a flow rate of the fan filter unit 142 is controlled to be increased, in order to accelerate the heat dissipation of the wafer 100A. Alternatively, on condition that the detect temperature is lower than the predetermined requirement, the processor 110 controls the fan filter unit 142 to slow down the heat dissipation of the wafer 100A.

In some alternative embodiments, on condition that the detected temperature exceeds the predetermined requirement, the processor 110 reduces the moving speed of the mechanical carrier 100C, in order to increase the duration time for the wafer 100A staying in the room 200. Accordingly, the cooling time of the wafer 100A is increased. Alternatively, on condition that the detected temperature is lower than the predetermined requirement, the processor 110 increases the moving speed of the mechanical carrier 100C, in order to reduce the duration time for the wafer 100A in the room 200. Accordingly, the cooling time of the wafer 100A is reduced.

With continued reference to FIG. 3, in operation S330, the adjusted temperature of the wafer is detected, in order to verify whether the adjusted temperature meet the predetermined requirement.

For illustration, as discussed above, the adjusted temperature of the wafer 100A in FIG. 1 is detected again by the detector 146 during the wafer 100A is moved from the first side to the second side of the fan filter unit 142. When the wafer 100A is moved to the location opposite to the detector 146, the detector 146 detects the temperature of the surface of the wafer 100A, and accordingly generates the data D2 including the value of the adjusted temperature to the processor 110. In some embodiments, the processor 110 processes the data D2 to compare the adjusted temperature with the predetermined requirement. If the detected temperature does not meet the predetermined requirement, the processor 110 then records the identification number of the wafer 100A to the memory 120.

The above illustrations include exemplary operations, but the operations are not necessarily performed in the order shown. Operations can be added, replaced, changed order, and/or eliminated as appropriate, in accordance with the spirit and scope of various embodiments of the present disclosure.

In some approaches, the temperature of the wafer 100A is only monitored during the wafer 100A is processed by at least one semiconductor process. In other words, the temperature of the wafer 100A that is post-processed is seldom monitored, in which the term "post-processed" indicates that a wafer is processed by at least one semiconductor process. As a result, for advance semiconductor technology, when forming some critical patterns on wafers, yield rates of the wafers are correlated with the temperature of the surface of the wafer. For example, when forming vias between two vertically stacked layers by an etching process, a failure may be occurred in a spot, which does not have an expected temperature, on the wafer. In some other situations, if the temperature of the post-processed wafers is kept being higher or lower, an outgassing rate and/or a chemical reaction on the wafers would be different. As a result, the quality of the post-processed wafers is reduced.

Compared with the approaches discussed above, with the arrangements of the system 100 in FIG. 1 and/or the method 300 in FIG. 3, the temperature of the post-processed wafer 100A can be further monitored and adjusted. As a result, the yield rate and the reliability of the wafer 100A are improved.

For ease of understanding, the embodiments discussed above are illustrated with the single wafer 100A. A number of the wafers applied in the embodiments above are given for illustrative purposes only. Various numbers of the wafers to be applied in a semiconductor foundry are with the contemplated scope of the present disclosure.

As discussed above, the system and the method disclosed in the present disclosure utilize detectors and fan filter unit to monitor and control the temperature of post-processed wafers. As a result, a high yield rate and a high reliability of the wafers can be achieved.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a system includes a cooling device, a memory, and a processor. The cooling device is configured to detect a temperature of a wafer and to provide air to the wafer. The memory is configured to store computer program codes. The processor is configured to execute the computer program codes in the memory to: determine whether the temperature of the wafer meet a predetermined requirement; adjust the temperature of the wafer on condition that the temperature does not meet the predetermined requirement; and control the cooling device to detect the temperature of the wafer again, in order to verify whether an adjusted temperature of the wafer meet predetermined requirement.

In some embodiments, a method includes following operations. A temperature of a wafer is detected by a first detector, in which the wafer is processed by at least one semiconductor process. The temperature of the wafer is adjusted on condition that the temperature does not meet a predetermined requirement. The adjusted temperature of the wafer is detected by a second detector, in order to verify whether the adjusted temperature of the wafer meet the predetermined requirement.

In some embodiments, a system includes a fan filter unit, a first detector, and a second detector. The fan filter unit is configured to provide air. The first detector is located at a first side of the fan filter unit, and is configured to detect a temperature of a post-processed wafer, in which the post-processed wafer is moved by a carrier to the first detector. One of the fan filter unit and the carrier is configured to adjust the temperature of the post-processed wafer on condition that the temperature of the post-processed wafer does not meet a predetermined requirement. The second detector is located at a second side of the fan filter unit, and is configured to detect the temperature of a post-processed wafer after the temperature of the post-processed wafer is adjusted by the fan filter unit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
a cooling device configured to detect a temperature of a wafer and to provide air to the wafer;
a memory configured to store computer program codes; and
a processor configured to execute the computer program codes in the memory to determine whether the temperature of the wafer meets a predetermined requirement;
adjust the temperature of the wafer on condition that the temperature does not meet the predetermined requirement; and
control the cooling device to detect the temperature of the wafer again, in order to verify whether an adjusted temperature of the wafer meet the predetermined requirement,
wherein the cooling device comprises:
a fan filter unit configured to provide the air;
a first thermal detector located at a first side of the fan filter unit, wherein the first thermal detector is configured to detect the temperature of the wafer during a movement of the wafer to the first side of the fan filter unit; and
a second thermal detector located at a second side of the fan filter unit, wherein the second thermal detector is configured to detect the adjusted temperature of the wafer during a movement of the wafer from the first side of the fan filter unit to the second side of the fan filter unit, wherein the second side is opposite to the first side with respect to the fan filter unit.

2. The system of claim 1, wherein the temperature of the wafer is detected during a movement of the wafer from a tool configured to perform at least one semiconductor process on the wafer.

3. The system of claim 1, wherein the processor is configured to adjust at least one of parameter, which is associated with the air, of the fan filter unit to adjust the temperature of the wafer.

4. The system of claim 3, wherein the at least one parameter comprises a flow rate of the air.

5. The system of claim 3, wherein the cooling device is arranged in a room, and the cooling device further comprises:
a thermal detector located with respect to the fan filter unit, the thermal detector configured to detect a room temperature of the room.

6. The system of claim 1, wherein the cooling device is arranged in a room, wherein the processor is configured to adjust a duration time for the wafer staying in the room, in order to adjust the temperature of the wafer.

7. The system of claim 6, wherein the wafer is moved by a mechanical carrier, the processor is further configured to adjust a moving speed of the mechanical carrier to adjust the duration time.

8. A method, comprising:
detecting, by a first detector, a temperature of a wafer, wherein the wafer is processed by at least one semiconductor process;
adjusting the temperature of the wafer on condition that the temperature does not meet a predetermined requirement, wherein adjusting the temperature of the wafer comprises:
providing, by a fan filter unit, air for the wafer; and
adjusting at least one parameter, which is associated with the air, of the fan filter unit on condition that the temperature does not meet the predetermined requirement; and
detecting, by a second detector, the adjusted temperature of the wafer, in order to verify whether the adjusted temperature of the wafer meets the predetermined requirement,
wherein detecting the temperature of the wafer by the first detector and detecting the adjusted temperature of the wafer by the second detector are operated at opposite sides of the fan filter unit with respect to the fan filter unit.

9. The method of claim 8, wherein the temperature of the wafer is detected by the first detector during a movement of the wafer from a tool configured to perform the at least one semiconductor process.

10. The method of claim 8, wherein the first detector is located at a first side of a room, the second detector is located at a second side of the room, and the wafer is moved from the first side to the second side of the room after being processed by the at least one semiconductor process.

11. The method of claim 10, wherein adjusting the temperature of the wafer comprises:
adjusting a duration time for the wafer staying in the room on condition that the temperature does not meet the predetermined requirement.

12. The method of claim 11, wherein the wafer is moved by a carrier, and adjusting the duration time comprises:
adjusting a moving speed of the carrier to adjust the duration time.

13. The method of claim 10, wherein the fan filter unit configured to provide air for the wafer is arranged in the room.

14. The method of claim 13, further comprising:
detecting, by a third detector arranged opposite to the fan filter unit, a room temperate of the room, in order to verify whether the at least one parameter is adjust to an expected value.

15. The method of claim 8, further comprising:
recording an identification number of the wafer on condition that the adjusted temperature of the wafer does not meet the predetermined requirement.

16. A system, comprising:
a fan filter unit configured to provide air;
a first detector located at a first side of the fan filter unit, the first detector configured to detect a temperature of a post-processed wafer receiving no air provided by the fan filter unit, wherein the post-processed wafer is moved by a carrier to the first detector and is detected during a movement of the post-processed wafer to the first side of the fan filter unit;
wherein one of the fan filter unit and the carrier is configured to adjust the temperature of the post-processed wafer on condition that the temperature of the post-processed wafer does not meet a predetermined requirement; and
a second detector located at a second side of the fan filter unit, the second detector configured to detect the temperature of the post-processed wafer receiving no air provided by the fan filter unit, after the temperature of the post-processed wafer is adjusted by the fan filter unit, wherein the temperature of the post-processed wafer is detected during a movement of the post-processed wafer to the second side of the fan filter unit.

17. The system of claim 16, wherein at least one parameter, which is associated with the air, of the fan filter unit is adjusted to adjust the temperature of the post-processed wafer.

18. The system of claim 16, wherein the fan filter unit is arranged in a room, and a moving speed of the carrier is adjusted to adjust a duration time for the post-processed wafer staying the room, in order to adjust the temperature of the post-processed wafer.

19. The system of claim 17, further comprising:
a third detector arranged between the first detector and the second detector, wherein the third detector is configured to verify whether the at least one parameter of the fan filter unit is adjusted to an expected value.

20. The system of claim 16, further comprising:
a processor configured to assign a command to one of the fan filter unit and the carrier to adjust the temperature of the post-processed wafer based on temperature of the post-process wafer detected by the first detector.

\* \* \* \* \*